United States Patent
Ding et al.

(10) Patent No.: US 10,627,934 B2
(45) Date of Patent: Apr. 21, 2020

(54) IN-CELL TOUCH PANEL, DISPLAY DEVICE AND DRIVING METHOD THEREOF

(71) Applicants: BOE Technology Group Co., Ltd., Beijing (CN); Beijing BOE Optoelectronics Technology Co., Ltd., Beijing (CN)

(72) Inventors: Xiaoliang Ding, Beijing (CN); Xue Dong, Beijing (CN); Xiaochuan Chen, Beijing (CN); Haisheng Wang, Beijing (CN); Yingming Liu, Beijing (CN); Shengji Yang, Beijing (CN); Weijie Zhao, Beijing (CN); Tao Ren, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 61 days.

(21) Appl. No.: 15/329,977

(22) PCT Filed: Jul. 22, 2016

(86) PCT No.: PCT/CN2016/091040
§ 371 (c)(1),
(2) Date: Jan. 27, 2017

(87) PCT Pub. No.: WO2017/063423
PCT Pub. Date: Apr. 20, 2017

(65) Prior Publication Data
US 2017/0269748 A1    Sep. 21, 2017

(30) Foreign Application Priority Data
Oct. 15, 2015    (CN) .......................... 2015 1 0665956

(51) Int. Cl.
*G06F 3/041* (2006.01)
*G02F 1/1333* (2006.01)
(Continued)

(52) U.S. Cl.
CPC ........ *G06F 3/0412* (2013.01); *G02F 1/13338* (2013.01); *G06F 3/044* (2013.01);
(Continued)

(58) Field of Classification Search
CPC ...... G06F 3/0412; G06F 3/0416; G06F 3/044; G06F 1/13338; G06F 2002/136218;
(Continued)

(56) References Cited

U.S. PATENT DOCUMENTS

2012/0062469 A1* 3/2012 Guard .................... G06F 3/044
345/173
2012/0153292 A1* 6/2012 Nakamura ........ G02F 1/133345
257/72
(Continued)

FOREIGN PATENT DOCUMENTS

CN    101866228 A    10/2010
CN    102004573 A    4/2011
(Continued)

OTHER PUBLICATIONS

Oct. 24, 2016—(WO) International Search Report and Written Opinion Apppn PCT/CN2016/091040 with English Tran.
(Continued)

*Primary Examiner* — Mark W Regn
(74) *Attorney, Agent, or Firm* — Banner & Witcoff, Ltd.

(57) ABSTRACT

An in-cell touch panel, a display device and a driving method thereof. The in-cell touch panel includes: an array substrate and an opposing substrate that are arranged opposite to each other; touch detection electrodes; touch-pressure sensing electrodes disposed between a layer provided with
(Continued)

the touch detection electrodes and a base substrate of the array substrate. A capacitor structure is formed by the touch-pressure sensing electrodes and a metal layer disposed below the array substrate; and a touch detection chip configured to simultaneously apply touch detection signals to the touch detection electrodes and the touch-pressure sensing electrodes in a touch period, determine a touch position by detecting capacitance variations of the touch detection electrodes, and determine a touch pressure value by detecting capacitance variations of the touch-pressure sensing electrodes.

20 Claims, 5 Drawing Sheets

(51) Int. Cl.
*G06F 3/044* (2006.01)
*H01L 27/12* (2006.01)
*H01L 27/32* (2006.01)
*G02F 1/1343* (2006.01)
*G02F 1/1368* (2006.01)
*G02F 1/1362* (2006.01)

(52) U.S. Cl.
CPC ........ *G06F 3/0416* (2013.01); *H01L 27/1255* (2013.01); *G02F 1/1368* (2013.01); *G02F 2001/13685* (2013.01); *G02F 2001/134372* (2013.01); *G02F 2001/136218* (2013.01); *G06F 2203/04103* (2013.01); *G06F 2203/04105* (2013.01); *H01L 27/323* (2013.01); *H01L 27/3262* (2013.01); *H01L 27/3272* (2013.01)

(58) Field of Classification Search
CPC ....... G06F 2002/13685; H01L 27/1255; H01L 27/323; H01L 27/3262; G02F 1/1368; G02F 2203/04105

USPC .......................................................... 345/174
See application file for complete search history.

(56) References Cited

U.S. PATENT DOCUMENTS

| 2014/0247239 | A1* | 9/2014 | Jamshidi-Roudbari ..................... G06F 3/0414 345/174 |
| 2014/0375911 | A1* | 12/2014 | Lee ..................... G02F 1/13338 349/12 |
| 2015/0325171 | A1* | 11/2015 | Zhou ..................... G09G 3/3233 345/80 |
| 2015/0382446 | A1* | 12/2015 | Kwon ..................... H05K 1/028 174/251 |
| 2016/0132155 | A1 | 5/2016 | Lee et al. |
| 2016/0187695 | A1 | 6/2016 | Cho et al. |
| 2016/0334903 | A1 | 11/2016 | Shepelev |

FOREIGN PATENT DOCUMENTS

| CN | 102262488 A | | 11/2011 |
| CN | 103034377 A | | 4/2013 |
| CN | 103823592 A | * | 5/2014 |
| CN | 204965385 U | | 1/2016 |
| CN | 105528110 A | | 4/2016 |
| JP | 2011170659 A | | 9/2011 |
| WO | 2015153668 A1 | | 10/2015 |

OTHER PUBLICATIONS

Nov. 18, 2016—(WO) International Search Report and Written Opinion Appn PCT/CN2016/094980 with English Tran.
Apr. 26, 2018—(WO) International Preliminary Report on Patentability Appn PCT/CN2016/091040.
Feb. 2, 2019—U.S. Office Action U.S. Appl. No. 15/519,883.
Jan. 3, 2020—(US) Office Action U.S. Appl. No. 15/519,883.

* cited by examiner

IN-CELL TOUCH PANEL, DISPLAY DEVICE AND DRIVING METHOD THEREOF

The application is a U.S. National Phase Entry of International Application No. PCT/CN2016/091040 filed on Jul. 22, 2016, designating the United States of America and claiming priority to Chinese Patent Application No. 201510665956.8 filed on Oct. 15, 2015. The present application claims priority to and the benefit of the above-identified applications and the above-identified applications are incorporated by reference herein in their entirety.

TECHNICAL FIELD

Embodiments of the present disclosure relate to an in-cell touch panel, a display device and a driving method thereof.

BACKGROUND

A pressure sensing technology is a technology capable of detecting an external force. The technology may be applied in the fields of industrial control, medical treatment, etc. Currently, in the display field, e.g., in the field of mobile phones or tablets, the pressure sensing means may be achieved by adding an additional mechanism on a backlight part of a liquid crystal display (LCD) panel or a middle-bezel part of a mobile phone. This design needs modification on the structural design of the LCD panel or the mobile phone. Moreover, as the fit tolerance is large, the detection accuracy of this design is also limited.

SUMMARY

Embodiments of the present disclosure provide an in-cell touch panel, comprising: an array substrate and an opposing substrate that are arranged opposite to each other; touch detection electrodes; touch-pressure sensing electrodes disposed between a layer provided with the touch detection electrodes and a base substrate of the array substrate. A capacitor structure is formed by the touch-pressure sensing electrodes and a metal layer disposed below the array substrate; and a touch detection chip configured to simultaneously apply touch detection signals to the touch detection electrodes and the touch-pressure sensing electrodes in a touch period, determine a touch position by detecting capacitance variations of the touch detection electrodes, and determine a touch pressure value by detecting capacitance variations of the touch-pressure sensing electrodes.

Embodiments of the present disclosure provide a display device, comprising the above in-cell touch panel and the metal layer disposed below the array substrate of the in-cell touch panel.

Embodiments of the present disclosure provide a driving method of the display device, comprising:

in the touch period within a time period for displaying each frame of the touch panel, simultaneously applying touch detection signals to the touch detection electrodes and the touch-pressure sensing electrodes, determining the touch position by detecting the capacitance variations of the touch detection electrodes, and determining the touch pressure value by detecting the capacitance variations of the touch-pressure sensing electrodes.

BRIEF DESCRIPTION OF THE DRAWINGS

In order to illustrate the technical solutions in the embodiments of the present disclosure or the existing arts more clearly, the drawings need to be used in the description of the embodiments or the existing arts will be briefly described in the following; it is obvious that the drawings described below are only related to some embodiments of the present disclosure, for one ordinary skilled person in the art, other drawings can be obtained according to these drawings without making other inventive work.

DETAILED DESCRIPTION

Hereafter, the technical solutions of the embodiments of the present disclosure will be described in a clearly and fully understandable way in connection with the drawings related to the embodiments of the disclosure. It is obvious that the described embodiments are just a part but not all of the embodiments of the present disclosure. Based on embodiments of the present disclosure, all other embodiments obtained by those skilled in the art without making other inventive work should be within the scope of the present disclosure.

Embodiments of the present disclosure provide an in-cell touch panel, a display device and a driving method thereof, which are used for achieving high-accuracy pressure sensing detection in the touch panel. For instance, the technical proposal provided by embodiments of the present disclosure can achieve high-accuracy pressure sensing detection only with small modification on hardware of the original display panel.

Detailed description will be given below to specific implementations of the in-cell touch panel, the display device and the driving method thereof provided by embodiments of the present disclosure.

The thickness and the shapes of various layers in the accompanying drawings do not reflect true scale and are only intended to illustrate the content of the present disclosure.

Figure 1:
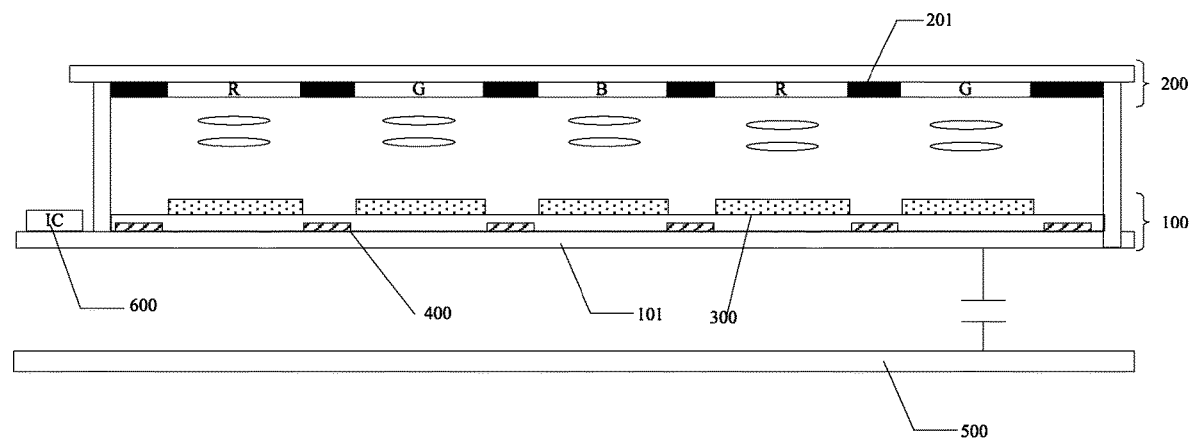
FIG. 1 is a schematic structural view of an in-cell touch panel provided by an embodiment of the present disclosure.

An embodiment of the present disclosure provides an in-cell touch panel as illustrated in FIG. 1, which comprises an array substrate 100 and an opposing substrate 200 that are arranged opposite to each other, and touch detection electrodes 300. The touch detection electrodes 300 may be disposed on one side of the array substrate 100 that faces the opposing substrate 200 and/or one side of the opposing substrate 200 that faces the array substrate. Description is given with reference to FIG. 1 by taking the case that the touch detection electrodes 300 are arranged on the array substrate 100 as an example. For instance, the touch detection electrodes 300 are disposed on one side of the array substrate 100 that faces the opposing substrate 200. The in-cell touch panel further comprises:

touch-pressure sensing electrodes 400 disposed between a layer provided with the touch detection electrodes 300 and a base substrate 101 of the array substrate 100, where a capacitor structure may be formed by the touch-pressure sensing electrodes 400 and a metal layer 500 disposed below the array substrate 100; and a touch detection chip 600 configured to simultaneously apply touch detection signals to the touch detection electrodes 300 and the touch-pressure sensing electrodes 400 during a touch period, determine a touch position by detecting capacitance variations of the touch detection electrodes 300, and determine a touch pressure by detecting capacitance variations of the touch-pressure sensing electrodes 400. For instance, the touch pressure may be a pressure produced by touch, and a value of the touch pressure may be a pressure value sensed at the touch position.

In the in-cell touch panel provided by the embodiments of the present disclosure, the touch-pressure sensing electrodes 400 disposed between the layer provided with the touch detection electrodes 300 and the base substrate 101 are added in the structure of the in-cell touch panel; the capacitor structure may be formed by the added touch-pressure sensing electrodes 400 and the metal layer disposed below the array substrate 100; when a position provided with a touch-pressure sensing electrode 400 is pressed, a distance between the touch-pressure sensing electrode 400 and the metal layer 500 changes, and a capacitance between the touch-pressure sensing electrode 400 and the metal layer 500 changes along with the distance change. Therefore, in the touch period, the touch detection chip 600 can simultaneously apply the touch detection signals to the touch detection electrodes 300 and the touch-pressure sensing electrodes 400. The touch detection chip 600 can determine a touch position by detecting a respective capacitance variation of each touch detection electrode 300 and hence achieve a touch detection function. Furthermore, the touch detection chip 600 can determine a pressure value at the touch position by detecting the capacitance variations of the touch-pressure sensing electrodes 400 and hence achieve a pressure sensing function. In the in-cell touch panel provided by the embodiments of the present disclosure, the touch-pressure sensing electrodes 400 are integrated into the touch panel, so that the pressure sensing function can be simultaneously achieved in the process of touch detection. The modification on the structural design of the display device is small, so that the limitation of the fit tolerance can be avoided, and hence better detection accuracy can be obtained and the production cost can be reduced.

For instance, the added touch-pressure sensing electrodes 400 are generally made from metallic materials. For the added touch-pressure sensing electrodes 400 to not affect an aperture opening ratio of the display region, patterns of the touch-pressure sensing electrodes 400 may generally be shielded by patterns of a black matrix layer 201. That is, regions of orthogonal projections of the patterns of the touch-pressure sensing electrodes 400 on the array substrate fall within regions of orthogonal projections of the patterns of the black matrix layer 201 on the array substrate. As illustrated in FIG. 1, the black matrix layer 201 may be disposed on one side of the opposing substrate 200 facing the array substrate, and may also be disposed on one side of the array substrate 100 facing the opposing substrate 200. No specific limitation will be given here.

Figure 2A:
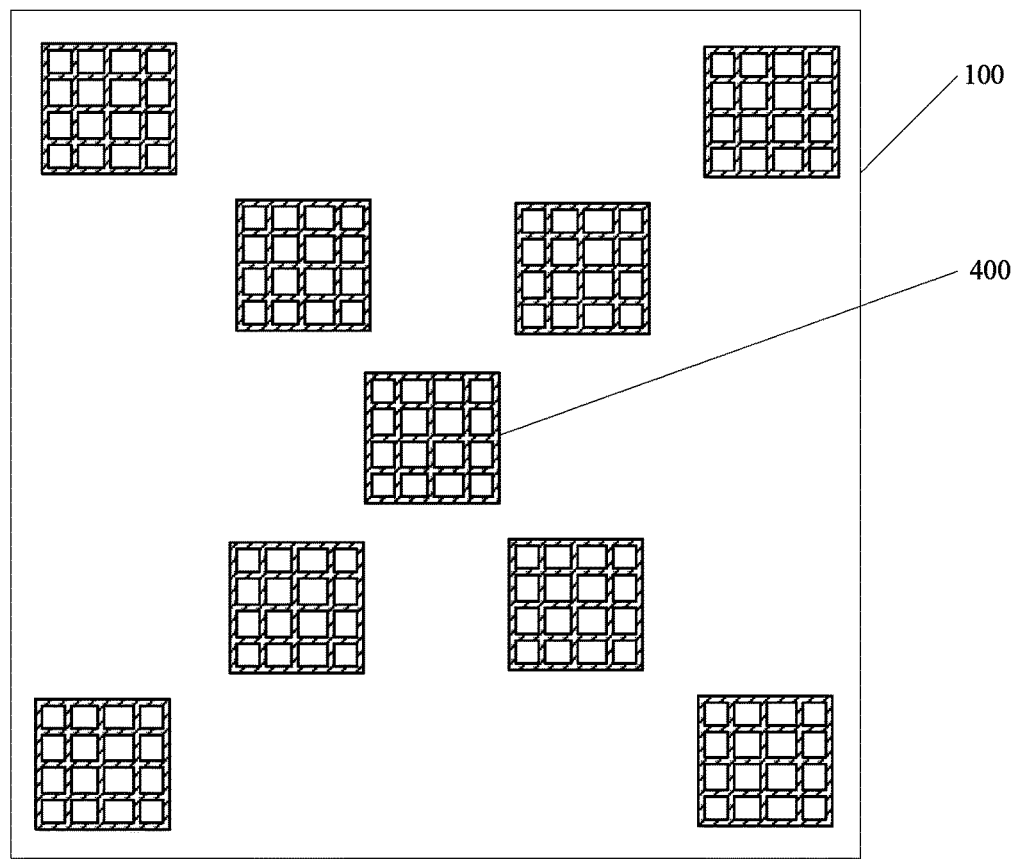
FIGS. 2a and 2b are respective schematic top views illustrating distribution of touch-pressure sensing electrodes in an in-cell touch panel provided by embodiments of the present disclosure.

Moreover, as illustrated in FIG. 2a, the patterns of the touch-pressure sensing electrodes 400 are generally set to be latticed structures, and orthogonal projections of the latticed structures on the array substrate 100 fall within the areas of the orthogonal projections of the patterns of the black matrix layer 201 on the array substrate. Each latticed structure may be formed by horizontal strip structures that have the same extension direction as gate lines and vertical strip structures that have the same extension direction as data lines. Of course, the patterns of the touch-pressure sensing electrodes 400 may also be only set to be horizontal strip structures or only set to be vertical strip structures. The patterns may be designed according to actual parameters. No limitation will be given here.

Figure 2B:
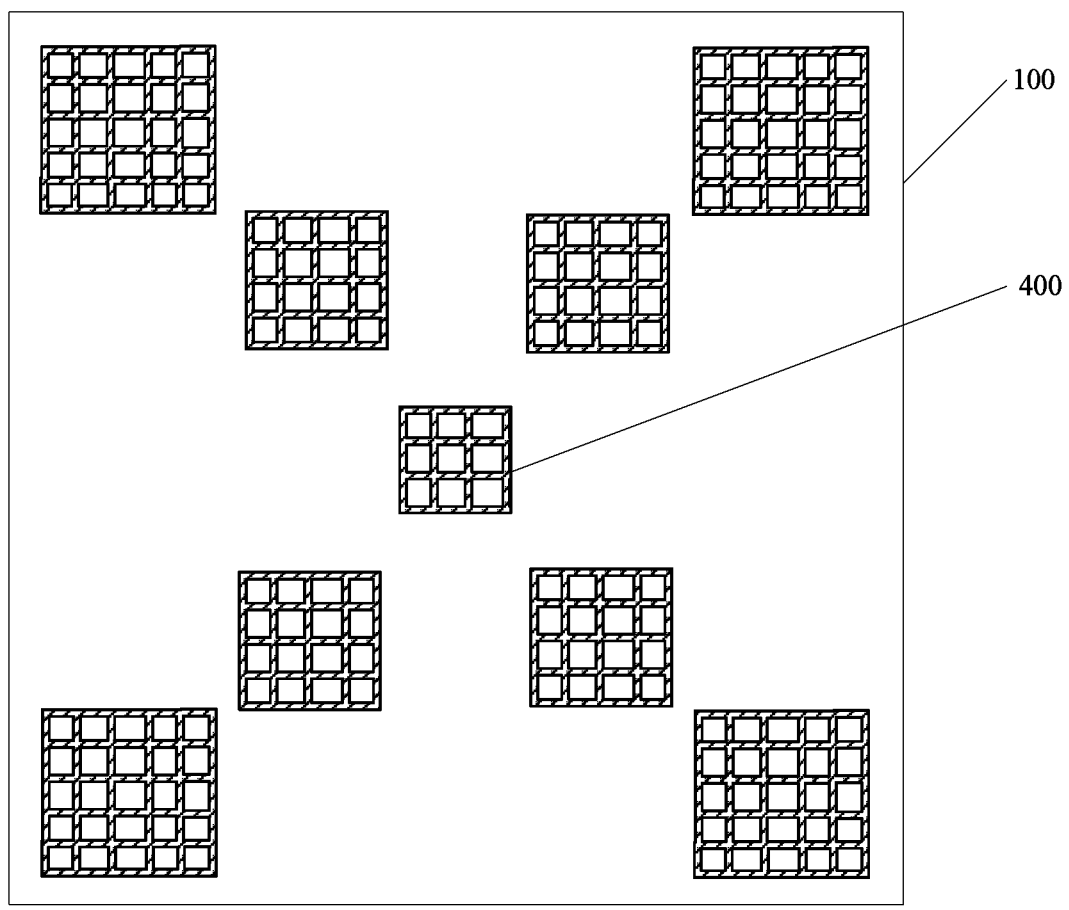

For instance, in the in-cell touch panel provided by the embodiments of the present disclosure, the size of each touch-pressure sensing electrode 400 and gaps between the touch-pressure sensing electrodes 400 may be set according to the accuracy of the specific touch pressure to be detected. Moreover, the in-cell touch panel is generally fixed on an outer frame of a display device via a border area. When a same force is adopted to press a central region and a boundary region of the in-cell touch panel respectively, touch-pressure sensing electrodes 400 in the central region can more easily convert the pressure into a distance change between the touch-pressure sensing electrodes and the metal layer disposed below. That is, the central region is more sensitive to pressure than the boundary region. Therefore, in the process of design, in order to obtain relatively uniform sensitivity of pressure sensing on the entire touch panel, as illustrated in FIG. 2b, areas of corresponding touch-pressure sensing electrodes 400 on the array substrate 100 are gradually increased along directions from the central region to the boundary regions of the array substrate 100. Or, the quantities of the corresponding touch-pressure sensing electrodes 400 per unit area are gradually reduced along the directions from the central region to the boundary regions of the array substrate 100. Or, along the directions from the central region to the boundary regions of the array substrate 100, the areas of corresponding touch-pressure sensing electrodes 400 on the array substrate 100 are gradually increased, and meanwhile, the numbers of the corresponding touch-pressure sensing electrodes 400 per unit area are gradually reduced.

Figure 3:
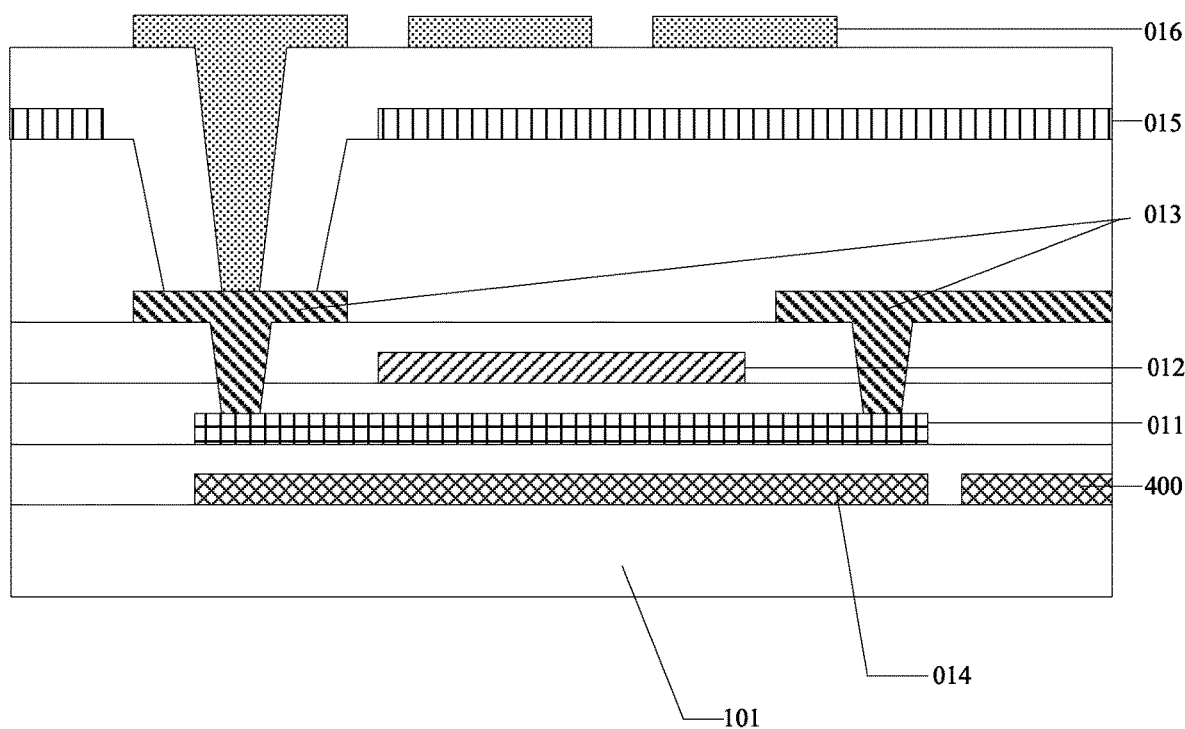
FIG. 3 is a schematic structural view of an array substrate in an in-cell touch panel provided by an embodiment of the present disclosure.

Currently, thin-film transistors (TFTs) in an array substrate applied in a display panel generally adopt amorphous silicon (a-Si) to form active layers. As the defects of a-Si can result in the problems of a low on-state current, a low migration rate, poor stability and the like of the TFTs, a-Si is limited in many fields. In order to make up for the defects of a-Si, the TFTs of the array substrate may adopt low-temperature poly-silicon (LTPS) as the active layers. The LTPS TFT of the array substrate may be a top-gate TFT structure. As illustrated in FIG. 3, the array substrate comprises: an active layer 011, a gate electrode 012, source/drain electrodes 013 and other layers sequentially arranged on the base substrate 101. Moreover, positions of a layer provided with the source/drain electrodes 013 and a layer provided with the gate electrode 012 may be exchanged. That is, the gate electrode 012 and the layer provided with the gate electrode may be formed at first, and subsequently, the source/drain electrodes 013 and the layer provided with the source/drain electrodes may be formed; or, the source/drain electrodes 013 and the layer provided with the source/drain electrodes may be formed at first, and subsequently, the gate electrode 012 and the layer provided with the gate electrode may be formed. No limitation will be given here. Description will be given below by taking the case that the gate electrode 012 and the layer provided with the gate electrode are formed at first and subsequently the source/drain electrodes 013 and the layer provided with the source/drain electrodes are formed as shown in FIG. 3 as an example. In order to prevent light of a backlight from being irradiated on the active layer 011 to produce photo-induced carriers that may affect the performance of the TFT, in the array substrate a shielding electrode 014 for preventing the light from being irradiated on the active layer 11 is also disposed under the active layer 011. That is, when the array substrate 100 is provided with the top-gate TFT, the shielding electrode 014 is disposed between layers provided with the top-gate TFT and the base substrate 101 of the array substrate. The shielding electrode 014 is configured to shield a pattern of the active layer 011 of the top-gate TFT.

Generally, as illustrated in FIG. 3, a pattern of the shielding electrode 014 is identical to the pattern of the active layer 011. Thus, in a specific implementation of the in-cell touch panel provided by the embodiments of the present disclosure, as illustrated in FIG. 3, the added touch-pressure sensing electrodes 400 may be formed on a layer provided with the shielding layer 014. That is, the touch-pressure sensing electrodes 400 and the shielding electrodes 014 are arranged in the same layer. Therefore, no additional process is required on the basis of an existing manufacturing process of the array substrate, so that the production cost can be reduced and the production efficiency can be improved.

Figure 4:
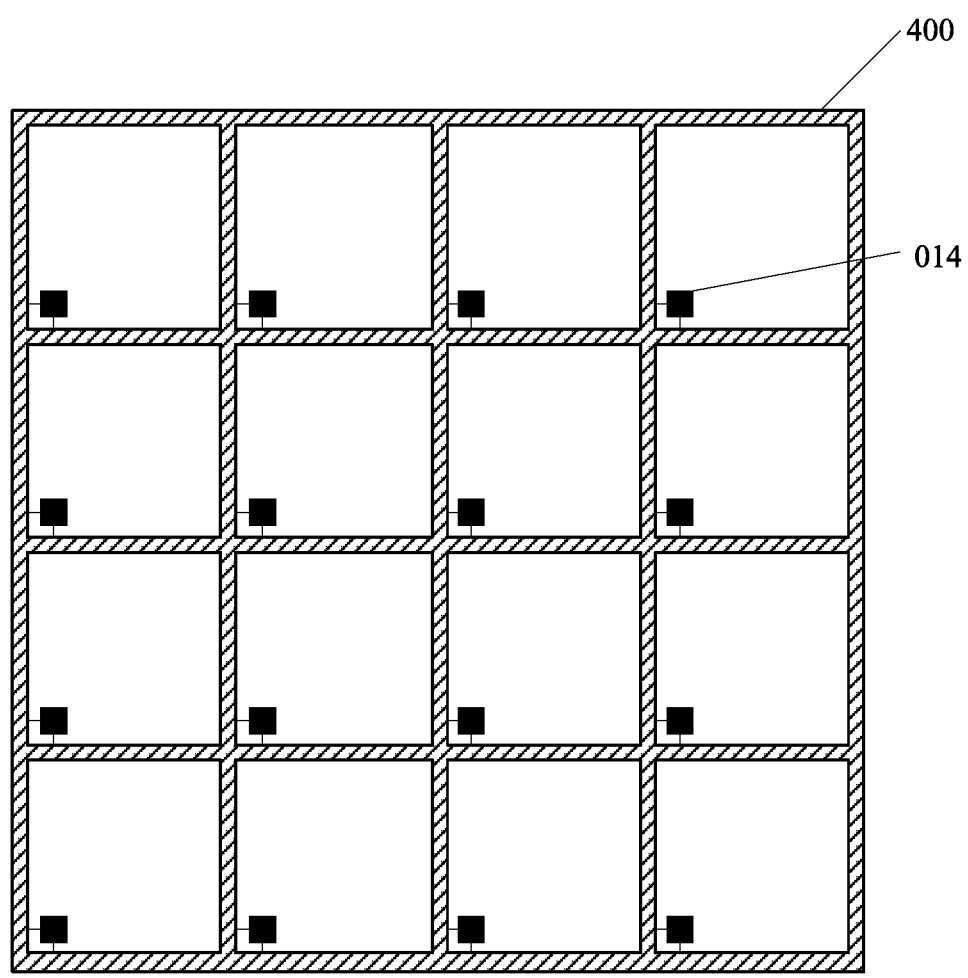
FIG. 4 is a schematic diagram of a touch-pressure sensing electrode in an in-cell touch panel provided by an embodiment of the present disclosure.

Moreover, as illustrated in FIG. 4, a plurality of shielding electrodes 014 are encircled by a latticed structure of a touch-pressure sensing electrode 400. In order to increase the sensing area of the touch-pressure sensing electrode 400, as illustrated in FIG. 4, the touch-pressure sensing electrode 400 may be electrically connected with the shielding electrodes 014 that are encircled by the touch-pressure sensing electrode.

For instance, on the top-gate TFT of the array substrate, as illustrated in FIG. 3, the array substrate generally also includes: a common electrode layer 015 and a pixel electrode 016. For instance, positions of the common electrode layer 015 and the pixel electrode 016 may be exchanged. That is, the common electrode layer 015 may be taken as a plate electrode and disposed on a lower layer (closer to the base substrate), and the pixel electrode 016 can be taken as a slit electrode and disposed on an upper layer (closer to a liquid crystal layer); or, the pixel electrode 016 can be taken as a plate electrode and disposed on the lower layer (closer to the base substrate), and the common electrode layer 015 can be taken as a slit electrode and disposed on the upper layer (closer to the liquid crystal layer). Of course, the common electrode layer 015 may also be disposed on the opposing substrate 200 arranged opposite to the array substrate 100; that is, no common electrode layer 015 is disposed on the array substrate 100. Description will be given below by taking the case that the common electrode layer 015 is disposed below the pixel electrode 016 as shown in FIG. 3 as an example.

For instance, in the in-cell touch panel provided by the embodiments of the present disclosure, the structures of the touch detection electrodes used for touch detection may have a plurality of implementations. For instance, the touch detection electrodes may be formed by a plurality of self-capacitive electrodes which are arranged in the same layer and independent of each other; or, the touch detection electrodes may also be formed by touch driving electrodes and touch sensing electrodes which are intercrossed with each other.

For instance, when the self-capacitive electrodes are adopted to achieve the touch detection function, the common electrode layer 015 in the array substrate 100 may be multiplexed as the self-capacitive electrodes; that is, the common electrode layer 015 on the array substrate 100 is formed by the self-capacitive electrodes. As illustrated in FIG. 3, when the structure of the common electrode layer 015 is altered and divided into the self-capacitive electrodes, no additional process is required on the basis of the conventional manufacturing process of the array substrate, so that the production cost can be reduced and the production efficiency can be improved.

For instance, in the in-cell touch panel provided by the embodiments of the present disclosure, in order to reduce the mutual interference between display and touch signals, a time-sharing driving approach in the touch period and the display period may be adopted. Moreover, a display driver IC and the touch detection chip may also be integrated into one chip, so that the production cost can be further reduced.

Figure 5:
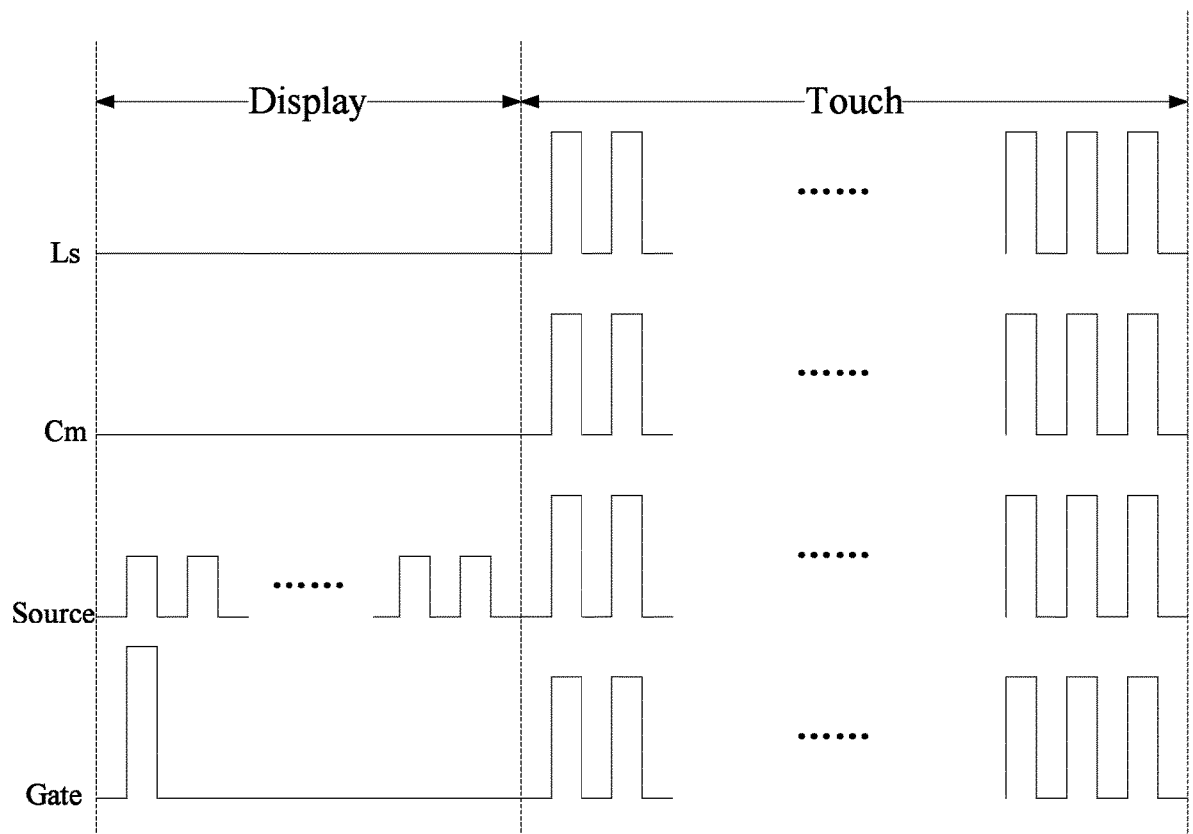
FIG. 5 is a schematic diagram illustrating a driving timing sequence of an in-cell touch panel provided by an embodiment of the present disclosure.

For instance, in the driving timing sequence as shown in FIG. 5, the time period for displaying each frame (V-sync) of the touch panel is divided into a display period and a touch period. In the display period: gate scanning signals are sequentially applied to each gate line Gate in the touch panel, and gray scale signals are applied to data lines Source; when the common electrode layer is multiplexed as the structure of the self-capacitive electrodes, the touch detection chip connected with the self-capacitive electrodes Cm applies common electrode signals to the self-capacitive electrodes Cm respectively, so as to achieve the liquid crystal display function. In the touch period, as shown in FIG. 5, the touch detection chip connected with the self-capacitive electrodes Cm applies touch detection signals to the self-capacitive electrodes Cm and the touch-pressure sensing electrodes Ls simultaneously, and meanwhile, receives feedback signals of the self-capacitive electrodes Cm and the touch-pressure sensing electrodes Ls, and determines whether a touch operation occurs or not and determines the sensing pressure by the analysis of the feedback signals, so as to simultaneously achieve the function of touch detection and the function of pressure sensing.

Moreover, as illustrated in FIG. 5, in order to prevent earth capacitance produced between the gate lines and the data lines in the array substrate and the touch-pressure sensing electrodes in the touch period from affecting the accuracy of pressure sensing, for instance, in the touch period electrical signals identical to the touch detection signals may be applied to the gate lines and the data lines in the array substrate, so that the earth capacitance between the gate lines and the data lines and the touch-pressure sensing electrodes can be eliminated, and hence the accuracy of pressure sensing can be improved.

It should be noted that the touch panel provided by the embodiments of the present disclosure may be applied in an LCD panel, may also be applied in an organic light-emitting diode (OLED) display panel, or may also be applied in other display panels. No limitation will be given here.

An embodiment of the present disclosure provides a display device, which comprises the in-cell touch panel and a metal layer disposed below the array substrate of the in-cell touch panel. The display device may be: any product or component with a display function such as a mobile phone, a tablet PC, a TV, a display, a notebook computer, a digital picture frame and a navigator. The implementations of the display device may be achieved with reference to the embodiments of the in-cell touch panel. No further description will be given here.

For instance, when the display device provided by the embodiments of the present disclosure is a mobile phone, the metal layer disposed below the touch panel may be a middle bezel of the mobile phone; and when the touch panel of the display device provided by the embodiments of the present disclosure adopts an LCD panel, the metal layer disposed below the touch panel may be a backlight metal on the back of a backlight module. Moreover, the backlight metal may be a metal frame coated on the outside of the backlight module or may also be a metal patch attached to the back of the backlight module. No limitation will be given here.

An embodiment of the present disclosure further provides a driving method of the display device, which comprises:

in a touch period within a time period for displaying each frame of the touch panel, simultaneously applying touch detection signals to the touch detection electrodes and the touch-pressure sensing electrodes, determining a touch position by detecting capacitance variations of the touch detection electrodes, and determining a touch pressure value by detecting capacitance variations of the touch-pressure sensing electrodes.

Moreover, the driving method further comprises: in the touch period, applying electrical signals identical to the touch detection signals to the gate lines and the date lines in the array substrate.

In the in-cell touch panel, the display device and the driving method thereof provided by the embodiments of the present disclosure, the touch-pressure sensing electrodes disposed between the layer provided with the touch detection electrodes and the base substrate of the array substrate are added in the structure of the in-cell touch panel; the capacitor structure may be formed by the added touch-pressure sensing electrodes and the metal layer disposed below the array substrate; and when a position of a touch-pressure sensing electrode is pressed, the distance between the touch-pressure sensing electrode and the metal layer changes, and the capacitance between the touch-pressure sensing electrode and the metal layer changes along with the distance change. Therefore, in the touch period, the touch detection chip can simultaneously apply the touch detection signals to the touch detection electrodes and the touch-pressure sensing electrodes, determine the touch position by detecting the capacitance variations of the touch detection electrodes and achieve the touch detection function, and determine the pressure value at the touch position by detecting the capacitance variations of the touch-pressure sensing electrodes and achieve the pressure sensing function. In the in-cell touch panel provided by the embodiments of the present disclosure, the touch-pressure sensing electrodes are integrated into the touch panel, so that the pressure sensing function can be simultaneously achieved in the process of touch detection. The modification on the structural design of the display device is small, so that the limitation of fit tolerance can be avoided, and hence better detection accuracy can be obtained and the production cost can be reduced.

It's to be noted that, in the drawings, for the clarity of the drawings the sizes of layers and areas may be exaggerated. And it can be understood, in the case that a component or a layer called "on" another element or layer, it can be directly on the top of the other elements, or can exist in the middle layer. Besides, it can be understood that, in the case that a component or a layer called "under" another element or layer, it can be directly under the other components, or there are at least two intermediate layers or elements. Besides, it can also be understood that, in the case that a layer or a component called "between" two layers or two elements, it can be the only layer of the two layers or two components, or it also exists at least two intermediate layers or elements. The similar reference marks indicate similar components in the whole text.

In the present disclosure, terms such as "first", "second" and the like used in the present disclosure do not indicate any sequence, quantity or significance but only for distinguishing different constituent parts. Also, the terms such as "a," "an," or "the" etc., are not intended to limit the amount, but indicate the existence of at lease one. The terms "comprises," "comprising," "includes," "including," etc., are intended to specify that the elements or the objects stated before these terms encompass the elements or the objects and equivalents thereof listed after these terms, but do not preclude the other elements or objects.

It is noted that, azimuth or positional relationships indicated by terms such as "up" and "down" and so on, are azimuth or positional relationships based on the drawings, which are only to facilitate description of the embodiments of the present disclosure and simplify the description, but not to indicate or imply that the devices or components must have a specific azimuth, or be constructed or operated in the specific azimuth, which thus cannot be understood as a limitation to the embodiments of the present disclosure. Unless otherwise clearly defined and limited, terms such as "installed", "coupled", "connected" should be broadly interpreted, for example, it may be fixedly connected, or may be detachably connected, or integrally connected; it may be mechanically connected, or may be electrically connected; it may be directly connected, or may be indirectly connected via an intermediate medium. Those skilled in the art can understand the specific meanings of the above-mentioned terms in the embodiments of the present disclosure according to the specific circumstances.

Obviously, those skilled in the art may modify the disclosure in various ways without breaking away from the spirits and scope of the disclosure. And so, if these changes and variations of the disclosure also fall within the scope of the claims or their equivalent technologies, the disclosure intends to include these changes and variations.

What are described above is related to the illustrative embodiments of the disclosure only and not limitative to the scope of the disclosure; any changes or replacements easily for those technical personnel who are familiar with this technology in the field to envisage in the scopes of the disclosure, should be in the scope of protection of the present disclosure. Therefore, the scopes of the disclosure are defined by the accompanying claims.

The present application claims the priority of the Chinese Patent Application No. 201510665956.8 filed on Oct. 15, 2015, which is incorporated herein by reference in its entirety as part of the disclosure of the present application.

What is claimed is:
1. An in-cell touch panel, comprising:
an array substrate and an opposing substrate that are arranged opposite to each other;
touch-pressure sensing electrodes and a shielding electrode that are arranged in the same layer and formed by the same material on a base substrate of the array substrate, wherein a capacitor structure is formed by the touch-pressure sensing electrodes and a metal layer disposed below the array substrate;
a thin-film transistor (TFT) located above the shielding electrode, the orthogonal projection of the active layer of the thin-film transistor on the base substrate falling within the area of the orthogonal projection of the pattern of the shielding electrode on the base substrate;
a common electrode layer and a pixel electrode layer that are arranged above the thin-film transistor, the common electrode layer of the array substrate also forming touch detection electrodes, and the touch detection electrodes comprising touch driving electrodes and touch sensing electrodes that are arranged in the same layer; and a touch detection chip configured to simultaneously apply touch detection signals to the touch detection electrodes and the touch-pressure sensing electrodes in a touch period, determine a touch position by detecting capacitance variations of the touch detection electrodes, and determine a touch pressure value by detecting capacitance variations of the touch-pressure sensing electrodes, so that realizing the detection of the touch position and determining the touch pressure value at the touch position at the same time.

2. The in-cell touch panel according to claim 1, wherein the touch detection electrodes are disposed on at least one of one side of the array substrate facing the opposing substrate or one side of the opposing substrate facing the array substrate.

3. The in-cell touch panel according to claim 2, wherein areas of corresponding touch-pressure sensing electrodes on the array substrate are gradually increased along directions from a central region to boundary regions of the array substrate.

4. The in-cell touch panel according to claim 2, wherein quantities of corresponding touch-pressure sensing electrodes per unit area are gradually reduced along directions from a central region to boundary regions of the array substrate.

5. The in-cell touch panel according to claim 2, wherein areas of corresponding touch-pressure sensing electrodes on the array substrate are gradually increased along directions from a central region to boundary regions of the array substrate, and quantities of corresponding touch-pressure sensing electrodes per unit area are gradually reduced along the directions from the central region to the boundary regions of the array substrate.

6. The in-cell touch panel according to claim 2, wherein the touch detection electrodes are a plurality of self-capacitive electrodes which are arranged in the same layer and independent of each other.

7. The in-cell touch panel according to claim 2, wherein the touch detection electrodes are touch driving electrodes and touch sensing electrodes which are intercrossed with each other.

8. The in-cell touch panel according to claim 2, wherein in the touch period electrical signals identical to the touch detection signals are respectively applied to gate lines and data lines in the array substrate.

9. The in-cell touch panel according to claim 1, further comprising: a black matrix layer disposed on one side of the opposing substrate facing the array substrate or disposed on one side of the array substrate facing the opposing substrate, wherein:
regions of orthogonal projections of patterns of the touch-pressure sensing electrodes on the array substrate fall within regions of orthogonal projections of patterns of black matrix layer on the array substrate.

10. The in-cell touch panel according to claim 9, wherein each of the patterns of the touch-pressure sensing electrodes is a latticed structure, each of the latticed structures has n×n metal meshes, and n is a positive integer;
the plurality of latticed structures are distributed on two diagonal lines of the base substrate, one of the latticed structures is located in a central region of the base substrate, along directions from a central region to boundary regions of the array substrate, the further latticed structure away from the central region, the n of the latticed structure is larger, and the n of adjacent two latticed structures differ by an integer 1.

11. The in-cell touch panel according to claim 9, wherein each of the patterns of the touch-pressure sensing electrodes is a latticed structure, each of the latticed structures has n×n metal meshes, and n is a positive integer;
the plurality of latticed structures are distributed on two diagonal lines of the base substrate, one of the latticed structures is located in a central region of the base substrate, along directions from a central region to boundary regions of the array substrate, each of the latticed structures has the same n, and the shape and size are similar or identical.

12. The in-cell touch panel according to claim 9, wherein each of the patterns of the touch-pressure sensing electrodes is a latticed structure, each the latticed structure has n×n metal meshes, and n is a positive integer;
the latticed structure has horizontally and vertically intersecting metal lines, the metal lines are located at the positions where horizontally and vertically intersecting gate lines and data lines of the array substrate are located, at least one pixel structure is encircled by one latticed structure, the latticed structure is electrically connected with the shielding electrode corresponding to the top-gate thin-film transistor in the at least one pixel structure encircled by the latticed structure.

13. The in-cell touch panel according to claim 1, wherein areas of corresponding touch-pressure sensing electrodes on the array substrate are gradually increased along directions from a central region to boundary regions of the array substrate; and/or
quantities of corresponding touch-pressure sensing electrodes per unit area are gradually reduced along the directions from the central region to the boundary regions of the array substrate.

14. The in-cell touch panel according to claim 1, wherein the touch detection electrodes are a plurality of self-capacitive electrodes which are arranged in the same layer and independent of each other; or
the touch detection electrodes are touch driving electrodes and touch sensing electrodes which are intercrossed with each other.

15. The in-cell touch panel according to claim 14, wherein a common electrode layer on the array substrate is formed by the self-capacitive electrodes.

16. The in-cell touch panel according to claim 1, wherein in the touch period electrical signals identical to the touch detection signals are respectively applied to gate lines and data lines in the array substrate.

17. A display device, comprising an in-cell touch panel, wherein the in-cell touch panel comprises:
an array substrate and an opposing substrate that are arranged opposite to each other;
a metal layer disposed below the array substrate;
touch-pressure sensing electrodes and a shielding electrode that are arranged in the same layer and formed by the same material on a base substrate of the array substrate, wherein a capacitor structure is formed by the touch-pressure sensing electrodes and a metal layer disposed below the array substrate;
a thin-film transistor (TFT) located above the shielding electrode, the orthogonal projection of the active layer of the thin-film transistor on the base substrate falling within the area of the orthogonal projection of the pattern of the shielding electrode on the base substrate;
a common electrode layer and a pixel electrode layer that are arranged above the thin-film transistor, the common electrode layer of the array substrate also forming touch detection electrodes, and the touch detection electrodes comprising touch driving electrodes and touch sensing electrodes that are arranged in the same layer; and a touch detection chip configured to simultaneously apply touch detection signals to the touch detection electrodes and the touch-pressure sensing electrodes in a touch period, determine a touch position by detecting capacitance variations of the touch detection electrodes, and determine a touch pressure value by detecting capacitance variations of the touch-pressure sensing electrodes, so that realizing the detection of the touch position and determining the touch pressure value at the touch position at the same time.

18. The display device according to claim 17, wherein the metal layer disposed below the in-cell touch panel is a middle bezel of a display module or a backlight metal on the back of a backlight module.

19. A driving method of a display device with an in-cell touch panel, the method comprising, in the in-cell touch panel:

arranging an array substrate and an opposing substrate opposite to each other;

arranging touch detection electrodes and a shielding electrode that also form a common electrode layer of the array substrate;

disposing a metal layer below the array substrate; in the same layer and formed by the same material on a base substrate of the array substrate, wherein a capacitor structure is formed by the touch-pressure sensing electrodes and a metal layer disposed below the array substrate;

arranging a thin-film transistor (TFT) above the shielding electrode, the orthogonal projection of the active layer of the thin-film transistor on the base substrate falling within the area of the orthogonal projection of the pattern of the shielding electrode on the base substrate; and arranging a common electrode layer and a pixel electrode layer above the thin-film transistor, the common electrode layer of the array substrate also forming touch detection electrodes, and the touch detection electrodes comprising touch driving electrodes and touch sensing electrodes that are arranged in the same layer;

wherein a time period for displaying each frame of the touch panel is divided into a display period and a touch period, wherein, in the display period: gate scanning signals are sequentially applied to each gate line in the touch panel, and gray scale signals are applied to data lines; when the common electrode layer is multiplexed as the structure of the self-capacitive electrodes, the touch detection chip connected with the self-capacitive electrodes applies common electrode signals to the self-capacitive electrodes respectively, so as to achieve the liquid crystal display function, and wherein in the touch period, the touch detection chip connected with the self-capacitive electrodes applies touch detection signals to the self-capacitive electrodes and the touch-pressure sensing electrodes simultaneously, simultaneously applying touch detection signals to the gate line and the data line, determining a touch position by detecting capacitance variations of the touch detection electrodes, and determining a touch pressure value by detecting capacitance variations of the touch-pressure sensing electrodes.

20. The driving method according to claim 19, further comprising:

applying electrical signals identical to the touch detection signals to gate lines and data lines in the array substrate respectively in the touch period.

* * * * *